United States Patent
Weiss et al.

(10) Patent No.: US 7,631,176 B2
(45) Date of Patent: Dec. 8, 2009

(54) RESISTOR/CAPACITOR BASED IDENTIFICATION DETECTION

(75) Inventors: Raphael Weiss, Plainview, NY (US); Richard E. Wahler, St. James, NY (US); John D. Virzi, Bayside, NY (US); Randy B. Goldberg, Massapequa, NY (US)

(73) Assignee: Standard Microsystems Corporation, Hauppauge, NY (US)

( * ) Notice: Subject to any disclaimer, the term of this patent is extended or adjusted under 35 U.S.C. 154(b) by 532 days.

(21) Appl. No.: 11/459,413

(22) Filed: Jul. 24, 2006

(65) Prior Publication Data

US 2008/0042701 A1    Feb. 21, 2008

(51) Int. Cl.
  *G06F 9/00*    (2006.01)
  *H03L 7/00*    (2006.01)
(52) U.S. Cl. .................... 713/1; 713/100; 327/143; 327/151
(58) Field of Classification Search .............. 713/1, 713/100; 327/143, 151
See application file for complete search history.

(56) References Cited

U.S. PATENT DOCUMENTS

| | | | |
|---|---|---|---|
| 4,264,879 A * | 4/1981 | Duley | ......................... 331/111 |
| 5,530,887 A | 6/1996 | Harper et al. | |
| 5,754,890 A * | 5/1998 | Holmdahl et al. | ............. 710/63 |
| 5,767,500 A | 6/1998 | Cordes et al. | |
| 5,794,032 A | 8/1998 | Leyda | |
| 5,974,474 A | 10/1999 | Furner et al. | |
| 6,690,171 B2 * | 2/2004 | Chen | ......................... 324/425 |
| 6,721,817 B1 | 4/2004 | Khosrowpour | |
| 7,028,175 B2 | 4/2006 | Morrison et al. | |
| 7,325,153 B2 * | 1/2008 | Terry | ......................... 713/501 |
| 7,394,729 B2 * | 7/2008 | Claseman | ................... 368/113 |
| 2003/0023777 A1 * | 1/2003 | Fields et al. | ................... 710/3 |

* cited by examiner

*Primary Examiner*—Chun Cao
*Assistant Examiner*—Stefan Stoynov
(74) *Attorney, Agent, or Firm*—Meyertons Hood Kivlin Kowert & Goetzel, P.C.; Jeffrey C. Hood

(57) ABSTRACT

A resistor/capacitor identification detection (RCID) circuit may provide system level identification of hardware (e.g. circuit board ID) through a single pin interface, by identifying up to a specified number of more than two quantized RC time constant states by measuring the discharge and charge times of an external RC circuit coupled to the single pin. The RCID circuit may initiate the discharge followed by a charging of the external RC circuit. The signal developed at the signal pin may be provided to the input of a threshold detector, with the threshold set at a specified percentage of a supply voltage used for operating the RCID circuit. The digitized output of the threshold detector may be used to gate a counter, after having been filtered through an input glitch rejection filter. A resolution of the counter may be determined by a high frequency clock used for clocking the counter. The numeric values of the charge and discharge times may be stored in data registers comprised in the RCID circuit.

26 Claims, 3 Drawing Sheets

| BIT | D7 | D6 | D5 | D4 | D3 | D2 | D1 | D0 |
|---|---|---|---|---|---|---|---|---|
| HOST TYPE | R/W | R/W | R/W | R | R | R | R | R |
| BIT DESCRIPTION | ENABLE | START | READ CHARGE | | | ERR | TC | DONE |

Control Register

| BIT | D7 | D6 | D5 | D4 | D3 | D2 | D1 | D0 |
|---|---|---|---|---|---|---|---|---|
| HOST TYPE | R/W | R/W | R/W | R/W | R/W | R/W | R/W | R/W |
| BIT DESCRIPTION | Low Byte [7:0] of a two byte register ||||||||

Preload Register - Low Byte

| BIT | D7 | D6 | D5 | D4 | D3 | D2 | D1 | D0 |
|---|---|---|---|---|---|---|---|---|
| HOST TYPE | R/W | R/W | R/W | R/W | R/W | R/W | R/W | R/W |
| BIT DESCRIPTION | High Byte [7:0] of a two byte register ||||||||

Preload Register - High Byte

| BIT | D7 | D6 | D5 | D4 | D3 | D2 | D1 | D0 |
|---|---|---|---|---|---|---|---|---|
| HOST TYPE | R | R | R | R | R | R | R | R |
| BIT DESCRIPTION | Low Byte [7:0] of a two byte register ||||||||

Count Register - Low Byte

| BIT | D7 | D6 | D5 | D4 | D3 | D2 | D1 | D0 |
|---|---|---|---|---|---|---|---|---|
| HOST TYPE | R | R | R | R | R | R | R | R |
| BIT DESCRIPTION | High Byte [7:0] of a two byte register ||||||||

Count Register - High Byte

*FIG. 3*

RESISTOR/CAPACITOR BASED IDENTIFICATION DETECTION

BACKGROUND OF THE INVENTION

1. Field of the Invention

This invention relates to pin interface design, and more particularly to designing a single-pin interface that can identify multiple states.

2. Description of the Related Art

A General Purpose Input/Output interface (GPIO) is typically used in embedded electronics systems to provide a set of I/O ports and/or I/O pins that can be configured as either inputs and/or outputs. In many cases, GPIO pins may support common serial bus protocols such as $I^2C$, Serial Peripheral Interface (SPI) and System Management Bus (SMBus). In many systems, various hardware components and/or integrated circuit (IC) chips may require system level identification of other interconnected or coupled hardware and/or system components. In such cases, one or more GPIO pins configured on any given IC chip may be used for providing system level identification to the IC chip about selected or specified hardware components/elements that are coupled and/or are interfacing with the IC chip.

The conventional method of providing system level identification of hardware components is to interface pull-up/pull-down resistors to selected GPIO pins. Since the input pins of GPIOs are limited to binary states, 'N' number of pins would typically be required to provide '$2^N$' states of information (system ID). In many cases, however, as warranted by the functionality of the given IC chip, the number of GPIO pins available for providing system level identification may be limited. It is therefore oftentimes desirable to create a system configurable ID that uses less pins, preferably a single pin, and inexpensive lumped components (e.g. resistors, capacitors, inductors, etc.) To provide more information on a single pin, various methods have been devised to enable the pin to handle more than the two states that is typically provided by pins in digital logic GPIOs. Most current single-pin system level identification methods utilize an analog-to-digital converter (ADC) and external resistor divider circuits to provide system level identification that requires more than two states. While ADCs work well for the system identification task, they typically comprise large and oftentimes complex circuit blocks, making ADC-based solutions somewhat expensive and impractical.

Many other problems and disadvantages of the prior art will become apparent to one skilled in the art after comparing such prior art with the present invention as described herein.

SUMMARY OF THE INVENTION

In one set of embodiments, judicious selection of resistor and capacitor values coupled to a logic circuit (or interface) capable of generating more than two states on a single pin may provide a low cost means to identify a system element configuration, e.g. circuit board identification (ID). A resistor/capacitor identification detection (RCID) interface may provide a single pin interface that can identify multiple quantized RC-constant states, e.g. up to 20 states. The RCID interface may comprise circuitry configured to measure the discharge and charge times for an RC circuit connected to a single I/O pin of the RCID interface. The RCID circuitry may be configured to initiate the discharge, followed by the charging of the external RC circuit. The input to the RCID circuitry taken from the single pin may pass through a threshold detector configured to detect when the voltage at the single pin has reached a specified voltage value. The specified voltage may be a percentage of the supply voltage, and may represent the voltage that would be reached from 0V when charging the RC circuit for a time period representing the time constant of the RC circuit, and/or from the supply voltage when discharging the RC circuit for a time period representing the time constant of the RC circuit. In one set of embodiments, the specified voltage may be set at 68% of the supply voltage, which may be set at 3.3V. The accuracy of the threshold detector may be ±1%. The output of the edge detector may provide a digitized input to a counter—which may be a 16-bit counter—having a specified resolution, e.g. a 69.8 ns/bit resolution. The digitized input may also pass through an input glitch rejection filter before reaching the 16-bit counter. Any change in input less than a certain value, (210 ns is some embodiments) may be ignored.

In one embodiment, the RCID circuitry may initiate the discharge of the external RC circuit via a FET device operating as a current sink, which may be a 12 mA current sink, controlled via a drive signal generated by a finite state machine (FSM) logic circuit. The counter may be operated using a high frequency clock signal running at a specified frequency, which may be 14.318 MHz in some embodiments, and which may also determine the resolution of the counter. The RCID circuit may include a clock transition circuit—also operated using the high frequency clock signal—coupling the counter to a Count register, a Preload register, and a Control register. Operation of the RCID circuit may be controlled by programming and/or reading the contents of the Control register. Operation of the RCID circuitry may include multiple states.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which:

FIG. 3 shows respective function tables for a data register, a preload register, and a control register comprised in the RCID logic circuit, according to one embodiment.

Figure 1:
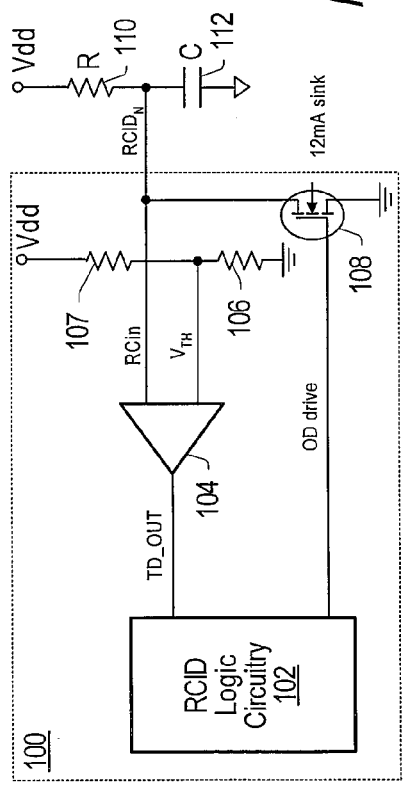
FIG. 1 shows one embodiment of resistor/capacitor identification detection (RCID) circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)."

DETAILED DESCRIPTION OF THE PREFERRED EMBODIMENTS

FIG. 1 is a block diagram of one embodiment of resistor/capacitor identification detection (RCID) circuit 100. RCID circuit 100 may comprise RCID logic circuitry (RLC) 102 configured to measure the discharge and charge times for an RC circuit comprising resistor 110 and capacitor 112 coupled to a single I/O pin corresponding to RCID circuit 100. RLC 102 may initiate the discharge, followed by the charging of the external RC circuit. Input RCin may simultaneously pass through a threshold detector 104, which may be configured to compare RCin to a threshold voltage $V_{TH}$ set at a specified percentage of supply voltage Vdd via a voltage divider circuit comprising resistors 106 and 107. In one embodiment, Vdd is set to 3.3V, and $V_{TH}$ is set to 2.2V, which is approximately 68% of Vdd. In some embodiments, the accuracy of threshold detector 104 may be ±1%. The output TD_OUT of threshold detector 104 may be provided to RLC 102, which may be configured to obtain/decode system element configuration identification based on at least the RC circuit. It should also be noted that threshold detector 104 may be any circuit and/or logic configured to compare the voltage RCin to a specified voltage/level/threshold.

Figure 2:
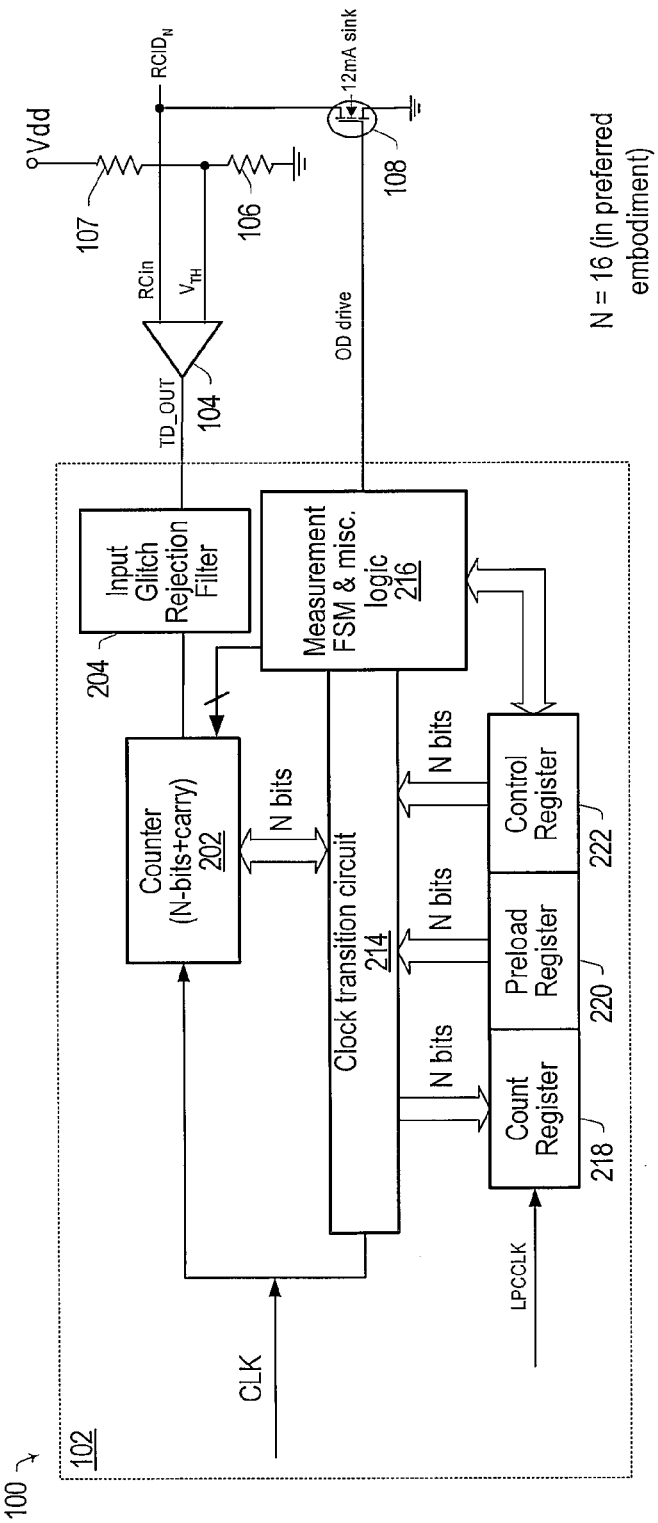
FIG. 2 shows one embodiment of an RCID logic circuit configured in the embodiment of FIG. 1.

FIG. 2 shows one embodiment of RLC 102 from FIG. 1. In this embodiment, output TD_OUT of threshold detector 104 serves as a digitized input to a counter 202, which may be a 16-bit counter, after passing through an input glitch rejection filter 204. Input glitch rejection filter may be a 3-clock filter, and counter 202 may have a specified resolution, e.g. a 69.8 ns/bit resolution. Any change in input less than a certain value, (210 ns is some embodiments) may be ignored. RLC 102 may initiate the discharge of the external RC circuit via FET device 108 operating as a current sink, which may be a 12 mA current sink, controlled via an OD drive signal generated by finite state machine (FSM) logic circuit 216. Clock transition circuit 214 and counter 202 may be operated using a clock signal CLK running at a specified frequency, which may be 14.318 MHz in some embodiments, and which may also determine the resolution of counter 202. RLC 102 may also comprise clock transition circuit 214, and Count register (i.e. Data register) 218, Preload register 220, and Control register 222. A function table for each of these registers according to one embodiment is shown in FIG. 3. Control register 222 may be programmed to control operation of RCID circuit 100. Preload register 220 may be configured to hold a preload value for counter 202, and Count register 218 may be configured to hold the latest value of counter 202 after the measurements for system identification detection have been completed by RLC 102. Preload register 220 and Count register 218 are shown as 16-bit registers for a 16-bit counter 202, but alternate embodiments may be configured with a counter that has more or less than 16 bits, with the number of bits of Preload register 220 and Count register 218 modified accordingly.

The overall operation of RCID circuit 100 may be divided into various functions/states. A first function/state may be a Reset function. RCID circuit 100 may enter Reset mode when the enable bit of control register 222 is cleared to '0' by a power-on-reset (POR) event or a write. The OD drive signal controlling FET device (current sink) 108 may be tri-stated, placing RLC 102 in low power mode. The DONE, ERR, and TC bits in the Control register may autonomously be cleared to '0'. In one embodiment, the DONE bit is a read-only status bit, which, when set indicates that RCID circuit 100 has completed a measurement. In one embodiment, the ERR bit is a read-only status bit, which, when set, indicates an error condition, more specifically that counter 202 has reached a terminal count value during the capacitive discharge or charge phase of the RC circuit (i.e. resistor 110 and capacitor 112) without the pin voltage (RCin) crossing the threshold voltage $V_{TH}$. In one embodiment, the TC bit is a read-only status bit, which, when set indicates that RCID circuit 100 has entered the TC-Discharged or TC-Charged measurement state, which will be further described below. The TC bit may be cleared when RCID circuit 100 enters the Reset state or Start measurement state, which will also be further described below. When writing to the Control register to clear the ENABLE bit, the START and READ_CHARGE bits may also need to be cleared to '0'. In one embodiment, clearing the ENABLE bit to '0' causes RCID circuit 100 to enter the Reset state, while setting the ENABLE bit to '1' enables the clock input CLK used for operating counter 202. In one embodiment, setting the START bit to '1' causes RCID circuit 100 to enter the Start measurement state, which will be further described below. Use of the READ_CHARGE bit will also be further described below. In some embodiments, it may be required to clear the ENABLE bit with a value of 0x00 in order to not create unpredictable results.

Another function/state of RCID circuit 100 may be a Preload function/state. With the ENABLE bit in the control register set to '1', a Preload count for the capacitive discharge may be written in the Preload register, which may comprise Preload register low-byte and Preload register high-byte in some embodiments, as shown in FIG. 3. In one embodiment, loading a value of 16'h0000 into the Preload register causes a maximum down-count of 4.58 ms if counter 202 is operated using a clock signal CLK of 14.318 MHz. Any other Preload count value may reduce the actual measurement time.

Another function/state of RCID circuit 100 may be a Start function/state. The START state may be initiated by a write to the Control register, setting the START bit to '1'. Counter 202 may be initiated to the Preload value from the Preload register as described above, and may start incrementing. The OD drive signal may operate to have FET device 108 begin to sink current, causing external capacitor 112 to start discharging. In one embodiment, the DONE, ERR, and TC bits in the control register are autonomously cleared to '0'. In one embodiment, when writing to the Control register to set the START bit, the READ_CHARGE bit may need to be set to '1' if only the capacitor charge time is to be read or cleared to '0' if both the discharge time and the charge time are to be read. In one embodiment, when writing to the Control register to set the START bit, the ENABLE bit may need to be set to '1'. As also indicated for the Reset mode, in some embodiments it may be required to clear the ENABLE bit with a value of 0x00 in order to not create unpredictable results.

Another function/state of RCID circuit 100 may be a Store Discharge function/state. In this state, the pin voltage (i.e. the voltage RCin at node $RCID_N$) may decay as external capacitor 112 discharges until the pin voltage reaches the threshold voltage $V_{TH}$ (as previously noted, 2.2V in some embodiments). If the READ_CHARGE bit in the control register has been cleared to '0', the present value of counter 202 (i.e. the value of RCin at the time the pin voltage reaches $V_{TH}$) may be stored in the Count register, which may comprise a Count register low-byte and a Count register high-byte in some embodiments, as shown in FIG. 3. Counter 202 may continue to increment until the terminal count has been reached.

Another function/state of RCID circuit 100 may be a TC Discharged function/state. In this state, following the Store Discharge state, counter 202 may continue incrementing until it reaches the terminal count value, which may be 0xFFFF in certain embodiments. The TC bit in the Control register may then be set to '1', indicating that the charge on capacitor 112 has been discharged. If the pin voltage (again, the voltage at node $RCID_N$) is above threshold value $V_{TH}$, then the ERR bit in the control register may autonomously be set to '1', indicating that capacitor 112 has not discharged to $V_{TH}$ within the allotted time period. The OD drive signal may be tri-stated, and counter 202 may start incrementing from 0x0000.

Another function/state of RCID circuit 100 may be a Store Charge function/state. In this state, following the TC Discharged state, capacitor 112 may be charged again. The pin voltage (voltage at node $RCID_N$) may rise to threshold voltage $V_{TH}$ and counter 202 may stop counting and retain its current value. The DONE bit in the Control register may then autonomously be set to '1', indicating that the measurement has been completed. In one embodiment, if the READ_CHARGE bit in the Control register has been set to '1', the present value of counter 202—representing the capacitor charging time—is stored in the Count register.

A next function/state of RCID circuit 100 may be a TC Charged function/state. In this state, following the Store Charge state, counter 202 may increment until it reaches the terminal count value, which may be 0xFFFF in one set of embodiments. In one embodiment, if the pin voltage (voltage at node $RCID_N$) is still below threshold voltage $V_{TH}$ at this time, then the ERR bit and DONE bit in the control register are autonomously set to '1', indicating that the measurement has been completed but with error.

An additional function/state of RCID circuit 100 may be a Read Charge function/state following the TC Charged state. In this state, if the READ_CHARGE bit in the control register has previously been set to '0' during the measurement, then the discharge value may be read after the measurement completes. After the DONE bit autonomously sets to '1' in the Control register, a write may be made to the Control register to set the READ_CHARGE and ENABLE bits to '1' and to clear the START bit to '0', thereby causing the present value of counter 202 (i.e. the charge time) to be stored in the count register.

In addition, RCID circuit 100 may be configured to compare count values stored in Count register 218 with expected results. For example, Logic circuit 216 may also be coupled to Count register 218 in addition to being coupled to Control register 222, and may be operable to store expected values with which it may compare the count values stored in Count register 218. In one set of embodiments, the count values stored in Count register 218 may be compared to expected results in other ways, for example software running on an embedded controller may compare the stored count value to N (ID states) upper and lower limits. This may provide one way to insure a correct correspondence between the stored count value and the ID value.

Figure 4:
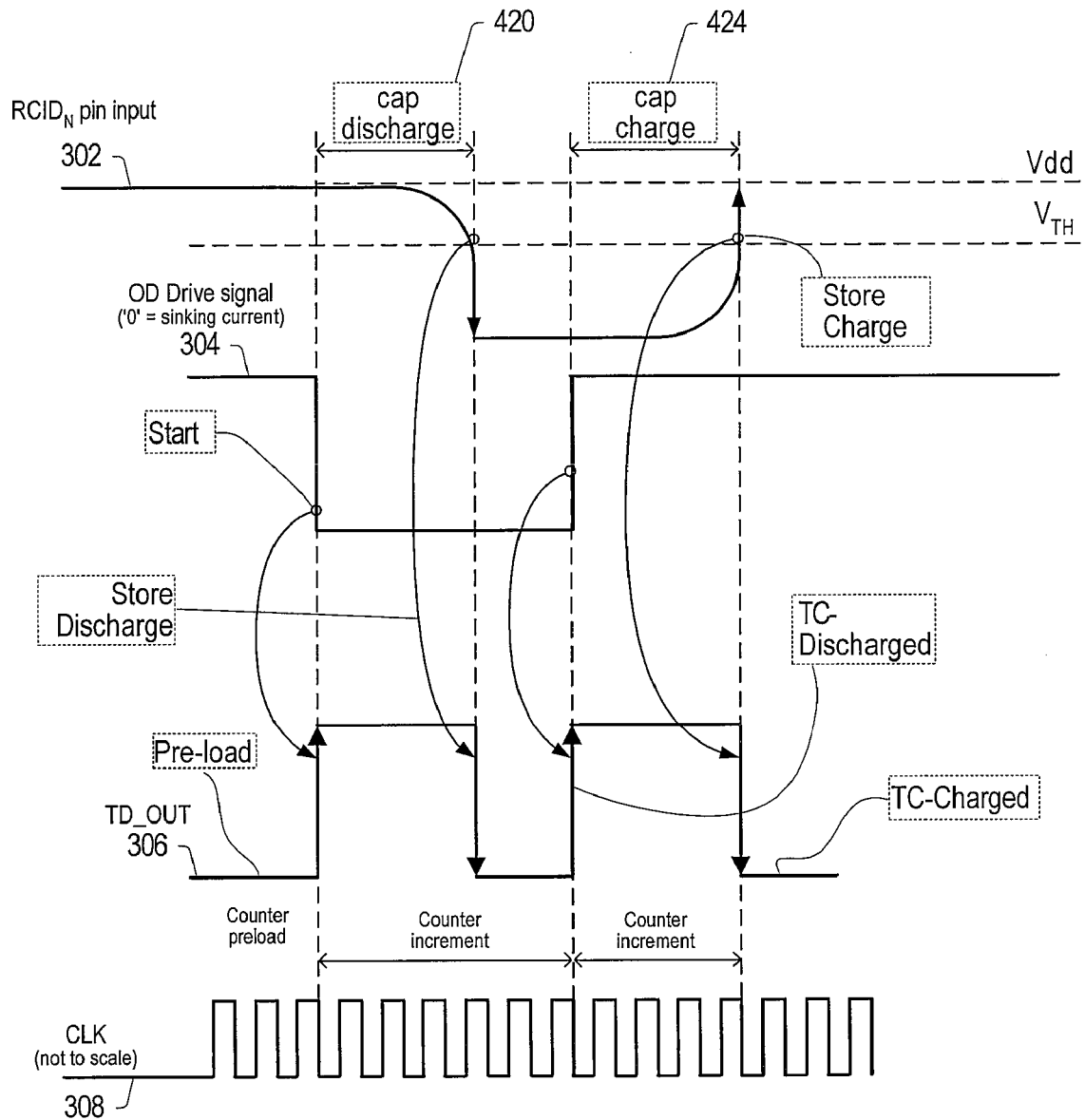
FIG. 4 shows a timing diagram illustrating operation of the RCID logic circuit according to one embodiment.

FIG. 4 shows a timing diagram illustrating operation of RCID circuit 100 according to one embodiment, showing the voltage waveforms of the pin voltage (voltage at node $RCID_N$) 302, OD drive signal 304, and output TD_OUT 306 of threshold detector 104, (i.e. the input to RLC 102), for the Start, Preload, Store Charge, Store Discharge, TC Charged, and TC Discharged states of RCID circuit 100. The Reset and Read Charge states are not represented in FIG. 4. If the READ_CHARGE bit in the control register is set to '1' during the Start state, only capacitor charge time 424 (of capacitor 112) may be read. If the READ_CHARGE bit in the control register is cleared to '0' during the Start state, both capacitor charge time 424 and capacitor discharge time 420 may be read. In one embodiment, if the READ_CHARGE bit in the control register is set to '1' during the Read Charge state, then the completed, measured capacitor charge time 424 is transferred to the count register. As previously noted, in one set of embodiments, Vdd shown in FIG. 4 may be specified as 3.3V, and $V_{TH}$ may be specified as 2.2V. Also, while in the preferred embodiments, setting a bit was interpreted as setting the value of that bit to '1', and resetting a bit was interpreted as setting the value of that bit to '0', in alternate embodiments, the set and reset value of a bit may each be selected to be either '1' or '0', and various implementations not shown herein are possible and are contemplated.

RCID circuit 100 is therefore capable of recognizing a specified number of states via a single pin, (which is more than the standard two states typically associated with a single pin), where each state may be determined by the time constant of a simple external RC circuit (i.e. the respective values of a single simple resistor and single simple capacitor), without requiring an ADC and/or external resistor dividers.

It should be noted again, that all voltage values and frequency values are presented herein to describe specific embodiments, and other embodiments with different voltage and/or frequency values are possible and are contemplated. Furthermore, the addition of clock signal LPCCLK & the associated clock transition circuit (clock domain crossing) 214 shown in FIG. 2 also represents a specific embodiment, and may not be included in alternate embodiments. It should also be understood that when referencing voltage and frequency values, actual values might differ from the designated and/or specified values, according to a variety of factors that may include process technologies, operating temperatures, and/or differences in the behavior of actual components used. For example, when referencing reaching and/or starting from a threshold voltage (including 0V), the actual threshold voltage may not be the exact specified value of the threshold voltage, but a value that is substantially close to the specified threshold voltage, e.g. within up to a few hundred mV. In addition, in some embodiments a reference voltage may be specified as ground.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A system for providing host system identification, the system comprising:

a pin configured to couple to a first circuit having a time constant;

a second circuit configured to compare a first voltage value with a pin voltage developed at the pin, and to generate a first signal indicative of whether the pin voltage has reached the first voltage value; and a third circuit configured to store a numeric value corresponding to the time constant, responsive to the first signal indicating that the pin voltage has reached the first voltage value, wherein the numeric value corresponds to identification information of a host system comprising the system;

wherein the third circuit is configured to signal an error condition when the pin voltage does not reach the first voltage value within a specified time period.

2. The system of claim 1, wherein the first circuit comprises a resistor and a capacitor each having two terminals, wherein one of the terminals of the resistor and one of the terminals of the capacitor are coupled to a common node, wherein the other terminal of the resistor is coupled to a supply voltage and the other terminal of the capacitor is coupled to a reference voltage, wherein the single pin is configured to couple to the common node.

3. The system of claim 1, wherein the third circuit is configured to obtain the numeric value by counting a number of clock cycles, wherein the number of clock cycles corresponds to one or more of:
- a first time period taken for the pin voltage to reach the first voltage value from a value of zero volts; or
- a second time period taken for the pin voltage to reach the first voltage value from a value of the supply voltage.

4. The system of claim 3, wherein the third circuit is configured to:
- initiate lowering the pin voltage from the value of the supply voltage if the pin voltage is at the value of the supply voltage; and
- initiate increasing the pin voltage from the value of zero volts if the pin voltage is at the value of zero volts.

5. The system of claim 4, wherein in initiating increasing the pin voltage, the third circuit is configured to passively permit the first circuit to increase the pin voltage from the value of zero volts.

6. The system of claim 1, wherein the third circuit comprises:
- a counter gated by the first signal, and configured to count to a specified value; and
- a count register configured to store a present value of the counter;
- wherein the numeric value is the present value of the counter when the pin voltage reaches the first voltage value.

7. The system of claim 5, further comprising a current sink coupled to the pin, wherein the current sink is configured to draw current to lower the pin voltage.

8. The system of claim 7, wherein the third circuit further comprises control circuitry configured to control the current sink and the counter.

9. The system of claim 8, wherein the third circuit further comprises a control register configured to store programmable control information used by the control circuitry to control the counter and the current sink.

10. The system of claim 8, wherein the third circuit further comprises a preload register configured to store a programmable preload value for the counter, wherein the counter is configured to count to the specified value starting from the preload value.

11. The system of claim 1, wherein the third circuit is configured to compare the numeric value to a plurality of expected values to obtain the identification information.

12. A method for providing host system identification, the method comprising:
- generating a voltage at a pin to obtain a first voltage value;
- decreasing the voltage at the pin;
- counting clock cycles from a beginning of said decreasing;
- obtaining a first number if a specified number of clock cycles is not reached before the voltage at the pin reaches a second voltage value, wherein the first number corresponds to a first time period, wherein the first time period corresponds to identification information of a host system comprising the pin; and
- signaling an error condition if the specified number of clock cycles is reached before the voltage at the pin reaches the second voltage value.

13. The method of claim 12, wherein said generating comprises applying a supply voltage having the first voltage value to an RC circuit coupled to the pin to charge a capacitor comprised in the RC circuit.

14. The method of claim 13, wherein said decreasing comprises sinking current from the RC circuit to discharge the capacitor.

15. The method of claim 12, further comprising:
- increasing the voltage at the pin; and
- counting clock cycles from a beginning of said increasing until the voltage at the pin reaches the first voltage value, to obtain a second number of clock cycles, wherein the second number of clock cycles corresponds to a second time period;
- wherein the second time period corresponds to the identification information of the host system comprising the pin.

16. The method of claim 15,
- wherein said generating comprises applying a supply voltage having the first voltage value to an RC circuit coupled to the pin to charge a capacitor comprised in the RC circuit;
- wherein said decreasing comprises sinking current from the RC circuit to discharge the capacitor; and
- wherein said increasing comprises allowing the capacitor to charge to the first voltage value.

17. The method of claim 12, further comprising storing the first number in a register.

18. The method of claim 12, further comprising preloading an initial count value to shorten a time span during which the specified number of clock cycles is reached when performing said counting the clock cycles until a specified number of clock cycles has been reached.

19. The method of claim 12, further comprising comparing the first number to a plurality of expected values to obtain the identification information.

20. A system comprising:
- a pin;
- an RC circuit comprising a resistor and a capacitor coupled in series between a supply voltage and a reference voltage, wherein the pin is coupled to a common node coupling the resistor to the capacitor;
- a comparator configured to compare a threshold voltage with a pin voltage developed at the pin, and further configured to generate a first signal indicative of whether the pin voltage has reached the threshold voltage; and
- a control circuit configured to receive the first signal and further configured to count a specified number of clock cycles;
- wherein the control circuit is configured to store a first value corresponding to a first number of clock cycles corresponding to a first time period taken for the pin voltage to reach the threshold voltage from a value of the supply voltage, when the control circuit reaches the first number of clock cycles before reaching the specified number of clock cycles, wherein the first value corresponds to a time constant of the RC circuit, wherein the time constant of the RC circuit is representative of hardware identification information of the system; and
- wherein the control circuit is configured to signal an error condition when the control circuit reaches the specified number of clock cycles before reaching the first number of clock cycles.

21. The system of claim 20, wherein the control circuit is configured to store a second value corresponding to a second number of clock cycles corresponding to a second time period taken for the pin voltage to reach the threshold voltage from a value of the reference voltage, when the control circuit reaches the second number of clock cycles before reaching the specified number of clock cycles, wherein the second value corresponds to the time constant of the RC circuit, wherein the time constant of the RC circuit is representative of hardware identification information of the system;
   wherein the control circuit is configured to signal an error condition when the control circuit reaches the specified number of clock cycles before reaching the second number of clock cycles.

22. The system of claim 20, further comprising a transistor device controlled by the control circuit and configured to draw current from the RC circuit to discharge the capacitor to lower the pin voltage.

23. The system of claim 20, wherein the control circuit comprises an N-bit counter operating at a specified clock frequency and gated by the first signal, wherein the counter is configured to count the specified number of clock cycles.

24. The system of claim 23, wherein the control circuit further comprises one or more of:
   a data register configured to store a present value of the counter;
   a preload register configured to store a programmable preload value for the counter; or
   a control register configured to store programmable control values used by the control circuit.

25. The system of claim 23, wherein the control circuit further comprises:
   a control register configured to store programmable control values used by the control circuit; and
   a control logic block coupled to the control register and further coupled to the counter, and configured to control operation of the control circuit according to the programmable control values.

26. The system of claim 23, wherein the control circuit further comprises an input glitch filter coupled between the first signal and the counter.

* * * * *

UNITED STATES PATENT AND TRADEMARK OFFICE
CERTIFICATE OF CORRECTION

PATENT NO. : 7,631,176 B2  Page 1 of 1
APPLICATION NO. : 11/459413
DATED : December 8, 2009
INVENTOR(S) : Weiss et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 669 days.

Signed and Sealed this

Second Day of November, 2010

David J. Kappos
*Director of the United States Patent and Trademark Office*